(12) United States Patent
Soflin

(10) Patent No.: US 11,836,421 B2
(45) Date of Patent: Dec. 5, 2023

(54) SYSTEM FOR CREATING AND MAINTAINING DYNAMIC MULTIDIMENSIONAL VIRTUAL BUILDING ENVIRONMENTS

(71) Applicant: LAYER, LLC, Lincoln, NV (US)

(72) Inventor: Zachary Soflin, Seward, NE (US)

(73) Assignee: LAYER, LLC, Lincoln, NE (US)

( * ) Notice: Subject to any disclaimer, the term of this patent is extended or adjusted under 35 U.S.C. 154(b) by 0 days.

(21) Appl. No.: 17/682,727

(22) Filed: Feb. 28, 2022

(65) Prior Publication Data

US 2022/0180018 A1  Jun. 9, 2022

Related U.S. Application Data

(63) Continuation of application No. 16/271,444, filed on Feb. 8, 2019, now Pat. No. 11,263,361.

(60) Provisional application No. 62/628,187, filed on Feb. 8, 2018.

(51) Int. Cl.
  *G06F 30/13* (2020.01)
  *G06N 20/00* (2019.01)
  *H04L 67/1097* (2022.01)

(52) U.S. Cl.
  CPC ............. *G06F 30/13* (2020.01); *G06N 20/00* (2019.01); *H04L 67/1097* (2013.01)

(58) Field of Classification Search
  None
  See application file for complete search history.

(56) References Cited

U.S. PATENT DOCUMENTS

| | | |
|---|---|---|
| 2015/0120297 A1 | 4/2015 | Meruva |
| 2015/0248504 A1 | 9/2015 | Glunz et al. |
| 2017/0132567 A1 | 5/2017 | Glunz |
| 2017/0132568 A1 | 5/2017 | Glunz |

*Primary Examiner* — Syed A Roni
(74) *Attorney, Agent, or Firm* — Suiter Swantz pc llo

(57) ABSTRACT

A mobile communications device for management of properties (e.g., leased units within a building or floor thereof) includes peripherals for use by the property manager to capture input and a display unit for interaction with a model of the managed property, e.g., virtual elements corresponding to features or fixtures and based on underlying building data and inputs submitted by contractors, tenants, and other stakeholders related to the installation, maintenance, or repair of the features or fixtures, or other tasks for completion. The peripherals likewise allow the manager to submit their own input, e.g., messages, audio, and/or images related to task updates. The mobile device may be programmed to analyze model elements, stakeholder input, and manager input to classify and determine relationships between these components, e.g., relating submitted images or messages to the appropriate managed units and/or the appropriate fixtures and features.

14 Claims, 15 Drawing Sheets

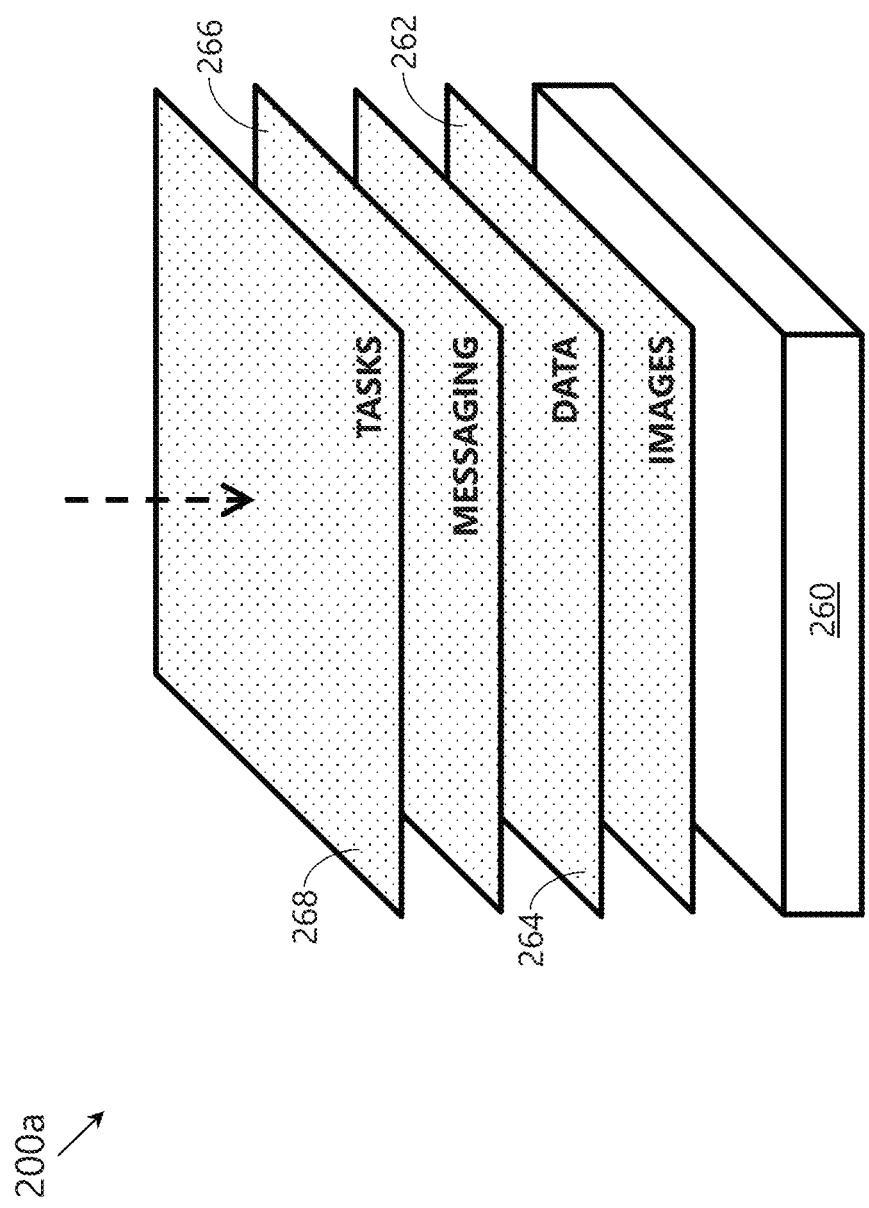

SYSTEM FOR CREATING AND MAINTAINING DYNAMIC MULTIDIMENSIONAL VIRTUAL BUILDING ENVIRONMENTS

CROSS-REFERENCE TO RELATED APPLICATIONS

The present application constitutes a continuation of the U.S. patent application Ser. No. 16/271,444 entitled SYSTEM FOR CREATING AND MAINTAINING DYNAMIC MULTIDIMENSIONAL VIRTUAL BUILDING ENVIRONMENTS, filed Mar. 9, 2016, which application issued Mar. 1, 2022 as U.S. Pat. No. 11,263,361. The instant application claims priority under 35 U.S.C. § 119(e) to provisional U.S. Patent Application Ser. No. 62/628,187, filed Feb. 8, 2018.

Said U.S. patent application Ser. No. 16/271,444 and 62/628,187 are herein incorporated by reference in their entirety.

BACKGROUND

Building Information Models (BIM) may allow architects, designers, and engineers to envision and generate a three-dimensional (3D) model of a building or structure and/or its components rather than, or in addition to, the traditional two-dimensional (2D) blueprints. For example, the BIM may add non-graphical information (e.g., material tolerances and performances, installation requirements, workmanship advisories) to the graphical model of the structure. A given BIM may achieve a level of maturity associated with its accessibility to, or shareability by, multiple collaborating stakeholders or parties involved in the design or construction of the building, e.g., architects and designers, structural engineers, contractors and subcontractors, clients. For example, a maturity level of zero may be associated with basic one-way distribution of a 2D blueprint, whether print or electronic. A maturity level of 1 may indicate some combination of 2D drafting and 3D computer-assisted drafting (CAD) but little or no effective collaboration, e.g., discrete CAD models not shared between stakeholders. Maturity level 2 may indicate some degree of shared non-graphical information between stakeholders, but these stakeholders may be using different CAD models: while federated models are achievable, different models may not be compatible. Finally, a maturity level of 3 indicates full collaboration, or a fully accessible and modifiable shared model maintained in a common environment.

Somewhat similarly, but separate and distinct from the concept of BIM maturity levels, a BIM may be characterized as multidimensional in scope. For example, graphically speaking, a building model may be a 2D blueprint or a 3D CAD model. However, a project model may include additional logical dimensions associated with additional non-graphical information about the project in its various stages. For example, four-dimensional (4D) BIM is generally associated with the incorporation of scheduling information (e.g., lead times, construction/installation times, curing/drying times) into the project model. Five-dimensional (5D) BIM may incorporate cost estimates based on the project model, and six-dimensional (6D) BIM may incorporate lifecycle data associated with operation or management of a building or facility beyond the completion date.

However, BIMs as described above may be limited as to the types of data that may be incorporated into a project model. For example, the supplemental non-graphical data that may be added by various collaborating parties may be restricted to text fields only. Text fields may not be indexable or easily searched, and it may be impossible or at least highly impractical for, e.g., contractors to supply dynamically updated information (changes in actual costs, completions ahead of or beyond schedule, unforeseen events that affect a construction or installation) as raw text. Furthermore, text fields may not be the optimal data format for some attributes of a project or for some end users; for example, a subcontractor (or tenant) may want to communicate to a contractor (or manager) that a particular fixture is damaged or has set improperly, and must be repaired. It may be more advantageous to all parties for this damage to be communicated visually, rather than ambiguously explained via text field.

SUMMARY AND DESCRIPTION

Embodiments of the inventive concepts disclosed herein may be directed to a mobile or portable device (e.g., computing and/or communications device) for use by a manager in the management of properties and/or component managed units therein, e.g., throughout one or more physical structures or floors thereof. The mobile device includes a touchscreen or other display unit for displaying to the manager logical models of the properties or subdivisions thereof (e.g., units, rooms). The mobile device includes memory for storing processor-executable instructions and peripheral devices for capturing audio-based, image-based, message-based, or other inputs submitted to the logical models by the manager. The mobile device includes processors programmed to provide interaction with the logical models by the manager by displaying virtual elements of the logical models corresponding to managed units and/or specific fixtures and features therein, e.g., for tracking installation, maintenance, repair, replacement, and/or costs related to the fixtures and features and related tasks. The displayed logical models further include stakeholder input submitted by other stakeholders in the managed units, e.g., updates by contractors or subcontractors tasked with specific installation, repair, or maintenance tasks and/or service requests by tenants. The mobile device is further programmed with a classification engine trained via machine learning to analyze elements of the logical model and inputs submitted by the stakeholders and manager, drawing relationships between the inputs and the logical model (e.g., analyzing submitted images to identify the specific fixtures or features to which they relate).

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 2A and 2B are diagrammatic illustrations of configurations of the logical model of FIG. 1;

DETAILED DESCRIPTION OF EXEMPLARY EMBODIMENTS

Figure 1:
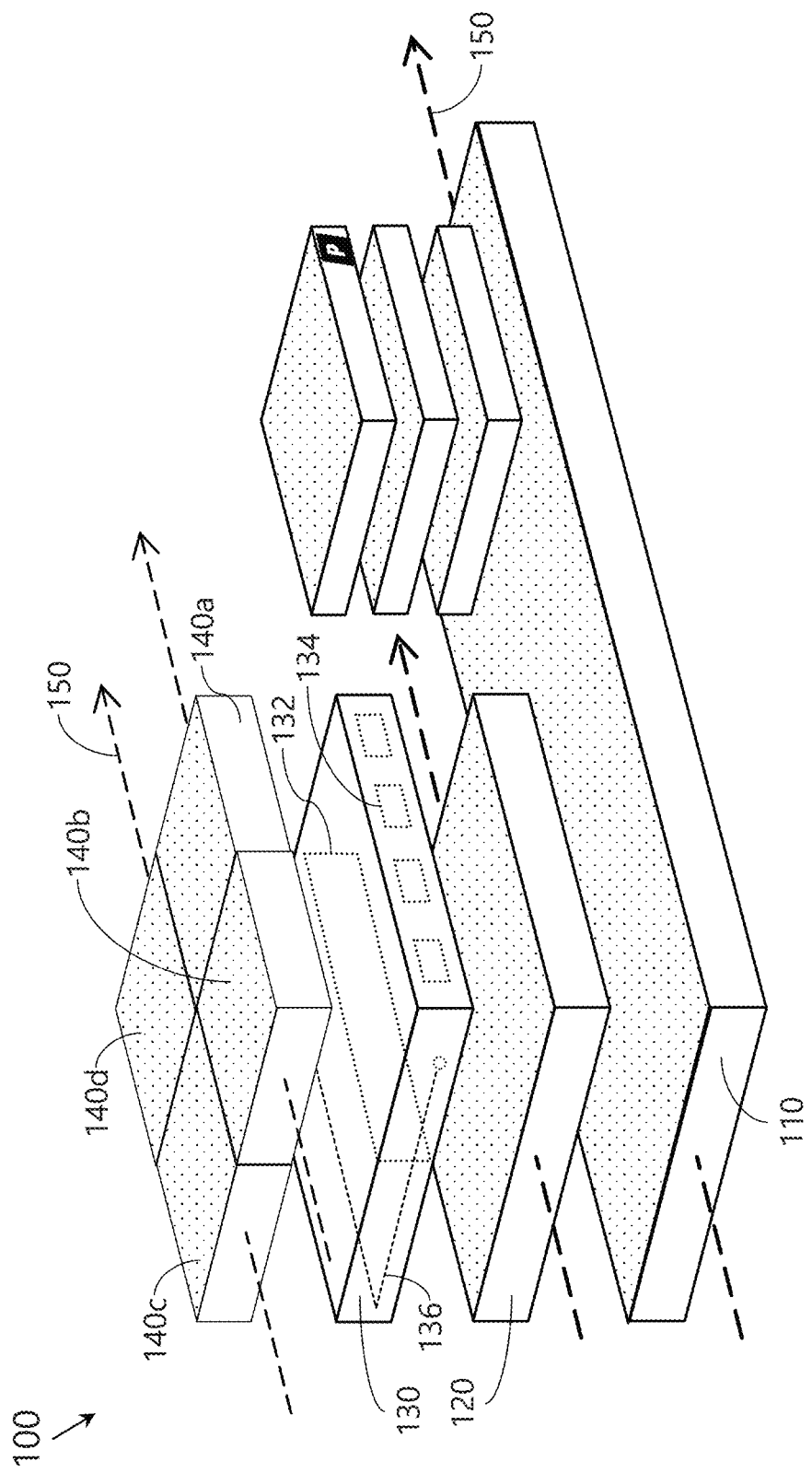
FIG. 1 is a diagrammatic illustration of an exemplary embodiment of a logical model according to the inventive concepts disclosed herein.

Referring generally to FIG. 1, a logical model 100 may be compatible with previously existing blueprints (2D, 3D CAD, Revit or like BIM structures) or similarly graphical representations of a building to be erected. For example, based on an analysis of the blueprint or design documents, the logical model 100 may populate basic information about the building including, e.g., dimensions, number of floors, floorplans and room sizes, utilities, interior and exterior fixtures, parts, components, and materials. The logical model 100 may be layered in that a model of the building may include, e.g., one or more sub-models corresponding to floors or wings of a building, each floor including one or more sub-models corresponding to hallways or rooms on that floor, each room including models of one or more elements fixtures (e.g., windows, doors, outlets) within that room. The precise configuration of the logical model 100 may vary depending upon the selected configuration (e.g., whether the logical model is accessed by a designer, contractor, or manager) or may be modified within a selected configuration. For example, windows and doors may be represented as elements associated with a particular floor rather than the room in which they are found, or a floor may be associated with a mix of elements tied to a particular room and elements associated more generally with the floor.

The logical model 100 may include a foundational layer (110) corresponding to the physical environment within which the building is to be erected. This foundational layer 110 may include not only the building itself but information about the surrounding lot and/or vicinity. At the foundational layer 110, the logical model 100 may interact with other such logical models corresponding to neighboring lots, buildings, or neighborhoods. The foundational layer 110 may include data associated with landscaping and landscape engineering, climactic information (e.g., rainfall and sunlight patterns, weather extremes, potential for erosion/depreciation/exterior wear and tear due to the elements), grading (e.g., soil composition, water table), access to transportation networks; electrical, water, and sewer access; traffic volumes and street/highway access; future unbuilt infrastructure (e.g., unbuilt highways or mass transit), parking requirements and structures; and local amenities. If the building to be erected includes a freestanding parking structure, for example, the foundational layer 110 may be linked to a second logical model (200) associated with the parking structure (as well as the logical model 100 associated with the building to be erected). The foundational layer 110 may be modified to incorporate future structures on the lot or within the physical environment but not erected (or conceived) until a later date.

Building information populated from the blueprints, as well as other building-wide data, may be organized on a structural layer 120 "above" the foundational layer 110. For example, the structural layer 120 may incorporate exterior features and/or claddings; HVAC, water, sewer, and other building-wide systems; internal load-bearing and structural features; and exterior views. A structural layer 120 may be linked to one or more floor layers 130, each floor layer corresponding to a level of the building and incorporating any interior and exterior features specific to that level, e.g., interior walls (132), windows (134), data or electrical outlets and lines (136). Each floor layer 130 may include one or more unit layers 140a-d (or, alternatively, floor layers may overlap with unit layers), each unit layer corresponding to a room, suite of rooms (e.g., an apartment or office suite), or subdivision of a floor or level.

Each layer of the logical model 100 may incorporate a time dimension, or time axis (150), such that the progression of each component of the environment may be mapped in time from concept to completion to demolition or repurposing, through changing layouts and uses along the entire lifecycle of each structure erected within the environment. Alternatively, the lifecycle of a defined physical environment may be extended to connect the construction, use, and demolition of a building at a given site with the conception, construction, and use of subsequent buildings (or, e.g., the division of a physical environment into separately owned and administered parcels of land, including any structures erected thereon). Along any given point on a time axis 150, the logical model 100 may reflect an accurate snapshot of the condition of the environment and incorporated structures at that time, including the state of any concepts or drawings, status of any ongoing constructions or installations, or management, use and/or repurposing of the completed building.

Figure 3A:
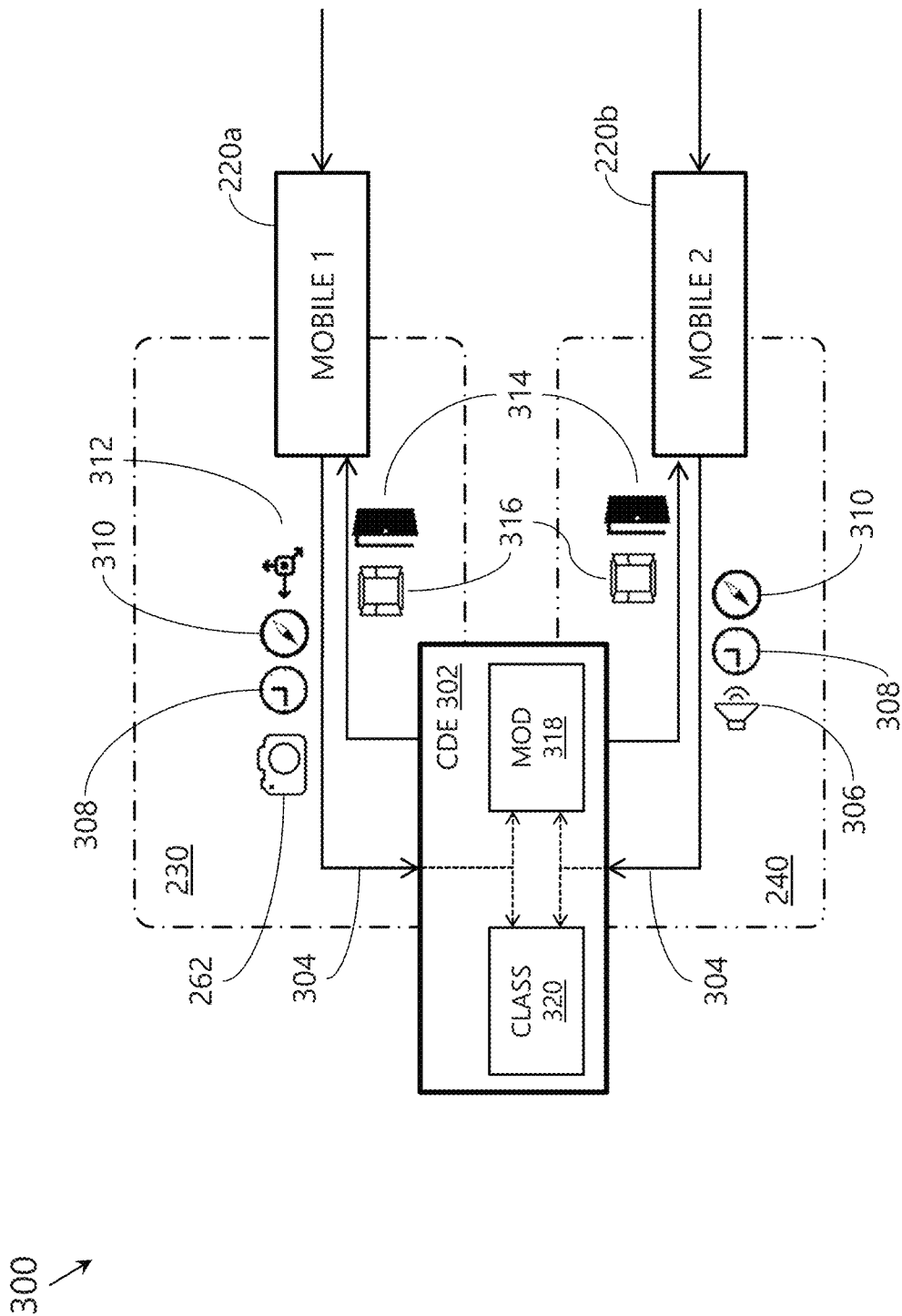
FIGS. 3A and 3B are diagrammatic illustrations of implementations of the logical model of FIG. 1.

Throughout construction (or renovation), the logical model 100 may be updated to reflect completion of various phases of construction, installation of interior systems, finishing of interior spaces, and so forth. For example, a contractor may finish the installation of a window (134) in a particular room on a particular floor (corresponding to the floor layer 130), uploading to the logical model 100 one or more photos of the installed window in place and/or the exterior view through said window from the room (see, e.g., FIG. 3A). The contractor may indicate textually the approximate location of the window 134, so that the logical model 100 may be updated to reflect the completion of that particular window. Alternatively, the logical model 100 may analyze the submitted images along with image metadata to infer the location of the window 134 and the proper location and/or orientation (e.g., pose data) of any images or views thereof, as shown by FIG. 3A.

Figure 2A:
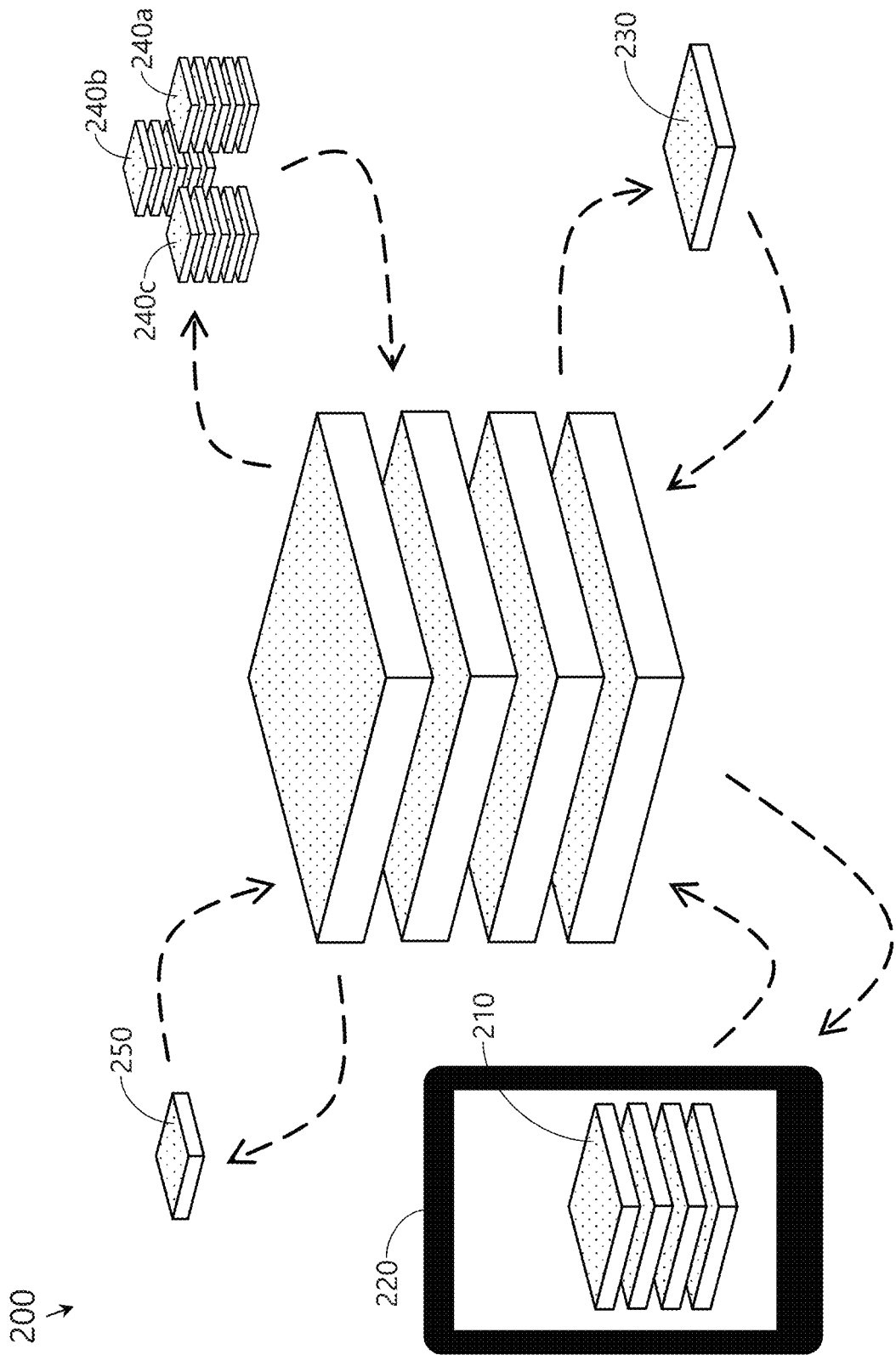

Referring generally to FIG. 2A, the logical model 200 may be implemented and may function similarly to the logical model 100 of FIG. 1, except that the logical model 200 may be adapted for different purposes or end users and allow a diverse group of end users to collaboratively update the logical model in real time. As previously discussed, the logical model 200 may incorporate multiple layers corresponding to logical components of the building. Various stakeholders may wish to interact with the logical model 200 in different ways depending on their priorities or needs. For example, architects or designers may need to view and/or modify a complete logical model (210) as building plans are conceived and finalized, and throughout the construction process as the physical structure takes shape (and diverges from the original plans in specific and documentable ways). The architect or designer may access and modify the architects' logical model (210) via a specially programmed mobile communications or computing device 220, e.g., a tablet, smartphone, or portable computer having a display unit (212); e.g., a screen or touchscreen capable of displaying portions of the logical model 210 or components thereof as selected by the user. However, contractors or subcontractors may concentrate on a particular floor or room to which they are assigned, and thus a contractor-based configuration (230) of the logical model may be restricted to a logical model of that floor or room, via which completion of each component or feature of the floor or room may be tracked to completion (and, e.g., throughout its use cycle). Similarly, after completion of the building, property managers may wish to interact with the logical model on a floor-by-floor level, tracking the maintenance, lifecycle, and replacement of any features or fixtures on a given floor (e.g., entering updates via text, image, video, or audio via the mobile device 220). Property managers (or, e.g., urban planners interested in the interaction of multiple structures) dealing with multiple structures may have access to multiple logical models (240a-c), each managers' model corresponding to a particular building under their supervision. Managers' models 240a-c may include, within each individual structure model, detailed floor-by-floor representations of maintenance issues or components, or representations of discrete (and adjustable) managed units within a floor. Service requests from tenants may be cross-referenced with specific fixtures or features on the corresponding floor or in the corresponding unit, and maintenance and repair visits may be tracked and scheduled (e.g., if an elevator has not required major repairs within a year, a preventative maintenance visit may be scheduled). Managers' models 240a-c may provide a means of inventory assessment on a building-wide, floor-wide, or suite-wide level to assist in repurposing of a structure or a portion thereof. Multiple end users may dynamically and simultaneously interact with the logical model 200 in real-time or near real-time via these various targeted models; e.g., updates to a contractor's model 230 tailored to a particular floor are incorporated into the main logical model 200 and reflected by subsequent iterations not only of the contractor's model 230, but of the architect's model 210 corresponding to the structure as a whole (or to the structure and its surrounding environment). In this way, multiple parties may collaborate in real-time throughout the planning, construction, and use cycle of the structure.

Tenants and lessors may wish to interact with the logical model 200 on a room-by-room or suite-by-suite basis, and thus another configuration of the logical model (250) may be oriented to tenants or prospective tenants. For example, tenants interested in a particular suite of rooms may access a logical model 250 corresponding to that suite, which may include detailed information on interior fixtures (i.e., the locations of plumbing, electrical, lighting, or data fixtures) within the suite as well as interior and exterior views of and from the suite (e.g., properly oriented photographs, audio recordings demonstrating the acoustical properties of the finished suite, convertible mockups of the suite adjustable to simulate variations in interior décor, or virtual-reality (VR)/augmented reality (AR) simulations of the suite, including 3D rotatable models or overhead simulations allowing for simulated furniture arrangement). VR/AR simulations may additionally be available through architects' and managers' models (210, 240a-c), e.g., at a floor-wide or building-wide level.

Referring now to FIG. 2B, the logical model 200a may be implemented and may function similarly to the logical model 200 of FIG. 2A, except that the logical model 200a may be implemented as an extension, or an augmentation, of conventional blueprints or computer-assisted BIM models 260 (e.g., Revit). For example, the BIM model 260 may represent a 2D or 3D model of a structure, and may be modifiable only by text fields. The logical model 200a may be synchronized with, or populated by, the BIM model 260, adding in contextual layers atop the BIM model images (262) corresponding to the progress or lifecycle of the structure (as well as its features and components); element data (264) such as non-textual information (e.g., cost information) relevant to the progress or lifecycle; messaging (266) between architects, contractors, managers, tenants, and other stakeholders (e.g., memorializing points on the time axis 250 (FIG. 1) such as the installation, completion, or repair of a building feature); and tasks (268), or representations of these installations or repairs, tracked until their completion and incorporating any messages, data or images relevant to the task or generated pursuant to its completion.

Referring to FIG. 3A, the logical model 300 may be implemented and may function similarly to the logical models 200, 200a of FIGS. 2A/B, except that the logical model 300 may be associated with a server-based or cloud-based common data environment (CDE) 302 accessible by various mobile devices 220a-b, each particular mobile device programmed to interact with a particular variant of the logical model 300 (e.g., a first mobile device 220a may be programmed for a contractor-oriented logical model 230 while a second mobile device 220b may be programmed for a manager-oriented logical model 240. Depending on the particular logical model 300, each mobile device 220a-b may submit updates and/or modifications (304) to the logical model in various data formats or combinations thereof, e.g., photographs or visual images 262, audio recordings 306, time data 308, location data 310, or pose (position/orientation) data) 312. Similarly, the logical model 300 may generate representations or "virtual elements" corresponding to individual elements or components of the building for the contractor-oriented logical model 230, the manager-oriented logical model 240, or other end user-specific variants. For example, the contractor-oriented logical model 230 and manager-oriented logical model 240 may interact with the logical model 300 via virtual "doors" (314), virtual "windows" (316), and other virtual counterparts to physical elements and aspects of the building, floor, or room. In this way, the contractor may track the installation of each physical element (e.g., via cost updates, images, messages, etc.) such that the manager (or architect, or other stakeholders) have detailed and accurate information about each element in real time or near real time. The CDE 302 may include a modeling engine 318 for generating the logical model 300, e.g., based on preprogrammed templates or according to user-determined parameters, and a classification engine (320) that may be "taught", e.g., on an unsupervised basis, to "learn" which physical elements are featured in or portrayed by incoming images (262) based on analysis of the images themselves as well as image metadata (e.g., time data 308, location data 310, pose data 312) and other input from end users of the logical model 300.

Figure 3B:
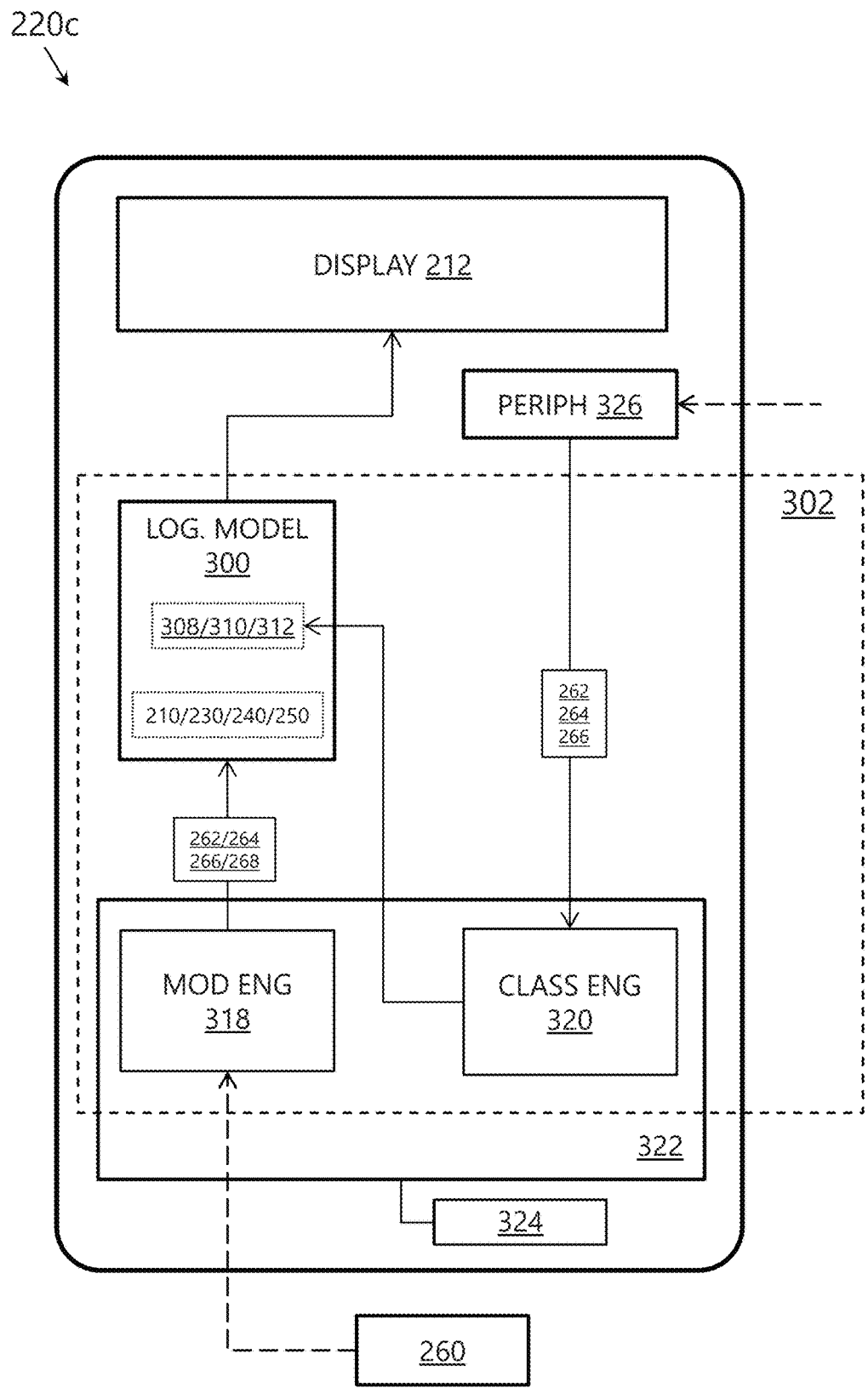

Referring to FIG. 3B, the mobile device 220c may be implemented and may function similarly to the mobile devices 220a-b of FIG. 3A, except that the CDE 302, including the modeling engine 318 and classification engine 320, may be at least partially embodied in the mobile device 220c (e.g., either in cloud-based storage or by the processor or processors (322) and memory/data storage 324 of the mobile device). For example, the logical model 300 may be generated by the modeling engine 318 according to an underlying blueprint, CAD, or BIM model 260, which may populate the logical model with, e.g., architect/designer models 210, contractor model 230, planner/manager model 240, tenant/prospect models 250, or other specialized models and generate virtual representations thereof via site attributes or status benchmarks such as images 262, background/element data 264, text/audio messages 266, and tasks/objectives to be completed 268. The logical model 300 may be accessed via a display unit or surface (212) of the mobile device 220c (e.g., via an appropriate portal tailored to the accessing stakeholder or model: architect, contractor, manager, tenant, etc.). The stakeholder may update the logical model 300 (e.g., based on new events in the construction, management, or leasing process) via cameras, microphones, input devices, and other peripherals 326 of the mobile device 220c. Updates to the logical model 300 (e.g., images 262, data or status updates 264, audio/text messaging 266, and any associated metadata (e.g., time data 308, location data 310, pose data 312)) may be analyzed by the classification engine 320 to determine relationships between the incoming updates and the logical model and properly contextualize the updates within the logical model to accurately reflect progress in, e.g., construction, management, leasing, or renovation.

Figure 4:
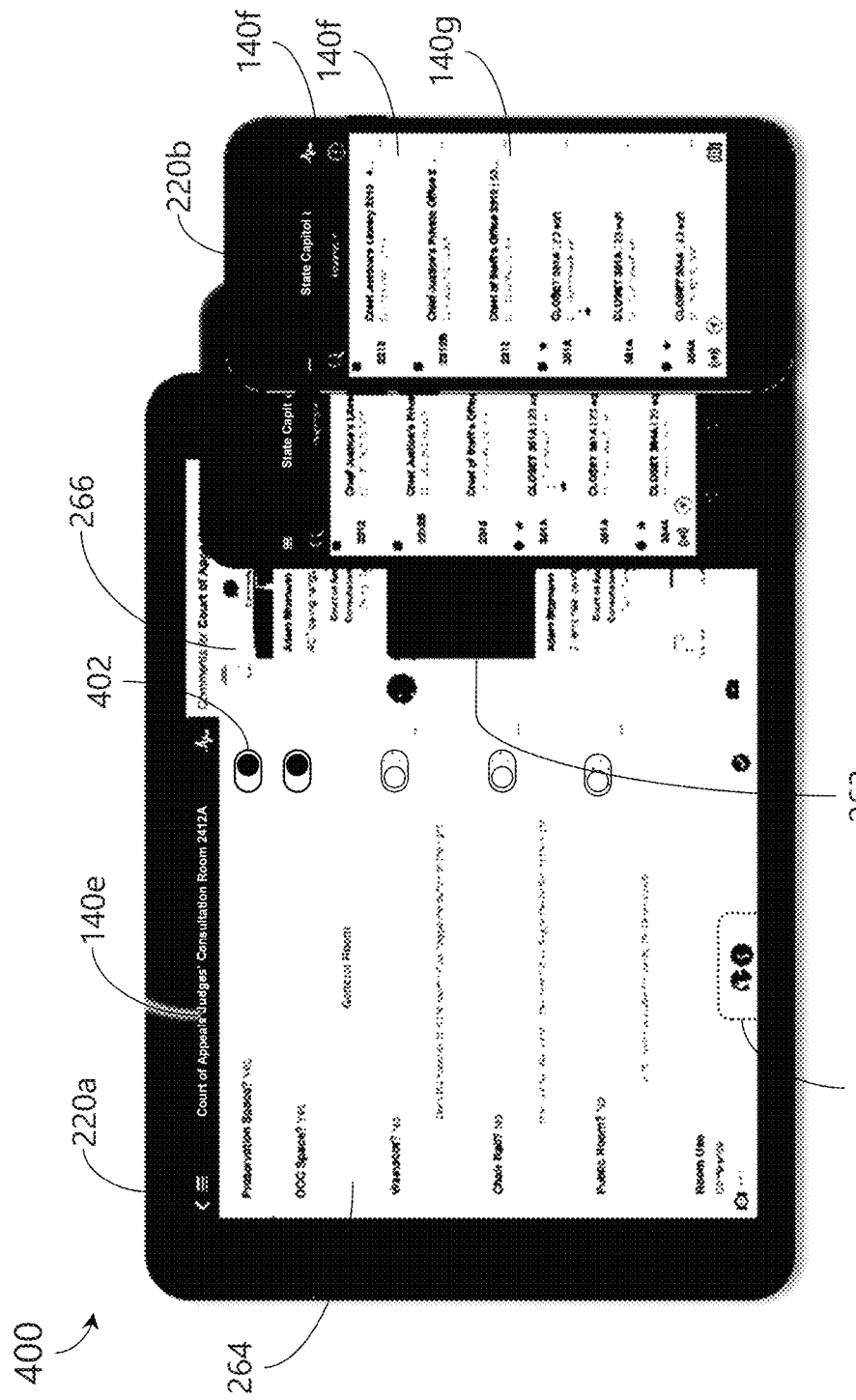
FIG. 4 is a view of operations of the logical model of FIG. 1.

Referring also to FIG. 4, the logical model 400 may be implemented and may function similarly to the logical model 300 of FIGS. 3A/B, except that the logical model 400 may be accessed by mobile devices 220a-c. For example, the mobile devices 220a-c may provide access to individual floor or unit layers (140e-g) within the logical model 400. The mobile devices may provide, within a particular unit layer 140e, access to images (262) corresponding to individual elements within the room corresponding to the unit layer (e.g., HVAC venting), element data (264) as to whether particular elements (e.g., railings, wainscoting, public/private use) are within the scope of the unit layer 140e (depending on whether or not said elements are present within the room), and messaging (266) as to the progress of the installation or repair of said elements. Element data 264 may be added or adjusted manually; for example, users may toggle on or off (402) aspects of, or elements potentially associated with, or found within, a given room, unit, or floor; for example, a particular unit (room) has a preserved status or is an occupied space, but does not include wainscoting or chair rails and is not open to the public. Furthermore, the logical model 400 may identify individual end users (404), e.g., architects, contractors, managers, or tenants currently collaborating via and contributing to the logical model, such that new requests and updates may be tracked by all collaborators.

Referring now to FIGS. 5A through 5E, the logical model 500 may be implemented and may function similarly to the logical model 400 of FIG. 4, except that the logical model 500 may include structural layers (120, FIG. 1) or floor layers (130) based on an underlying BIM model (260, FIG. 2B). For example, within a given floor layer 130, various unit layers (140) may be accessible, the unit layers corresponding to subsections or rooms within the corresponding floor currently under construction or repair (e.g., or which are associated with ongoing tasks (268, FIG. 2B)).

Figure 5A:
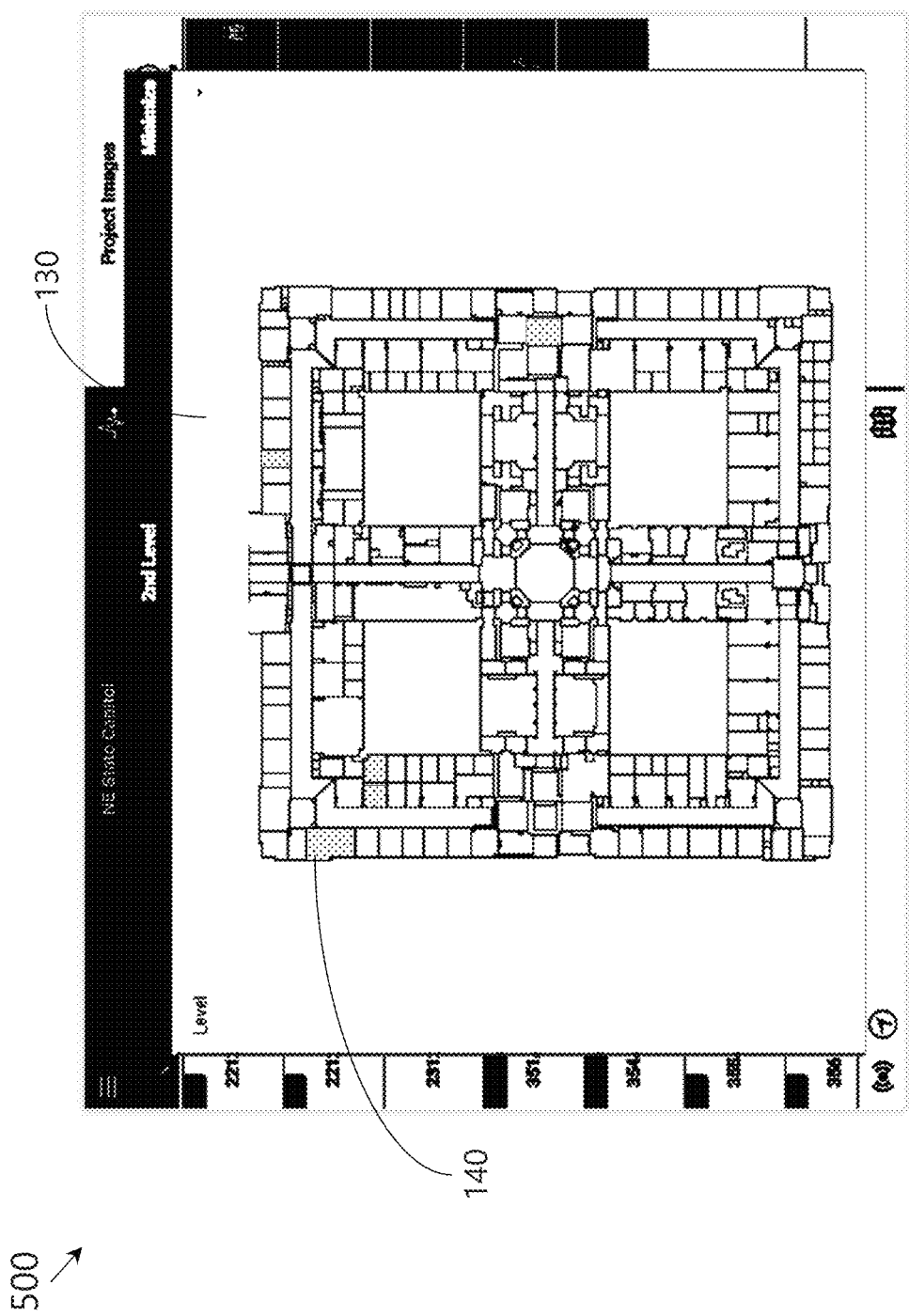
FIGS. 5A through 5E are views of operations of the logical model of FIG. 1.
Figure 5B:
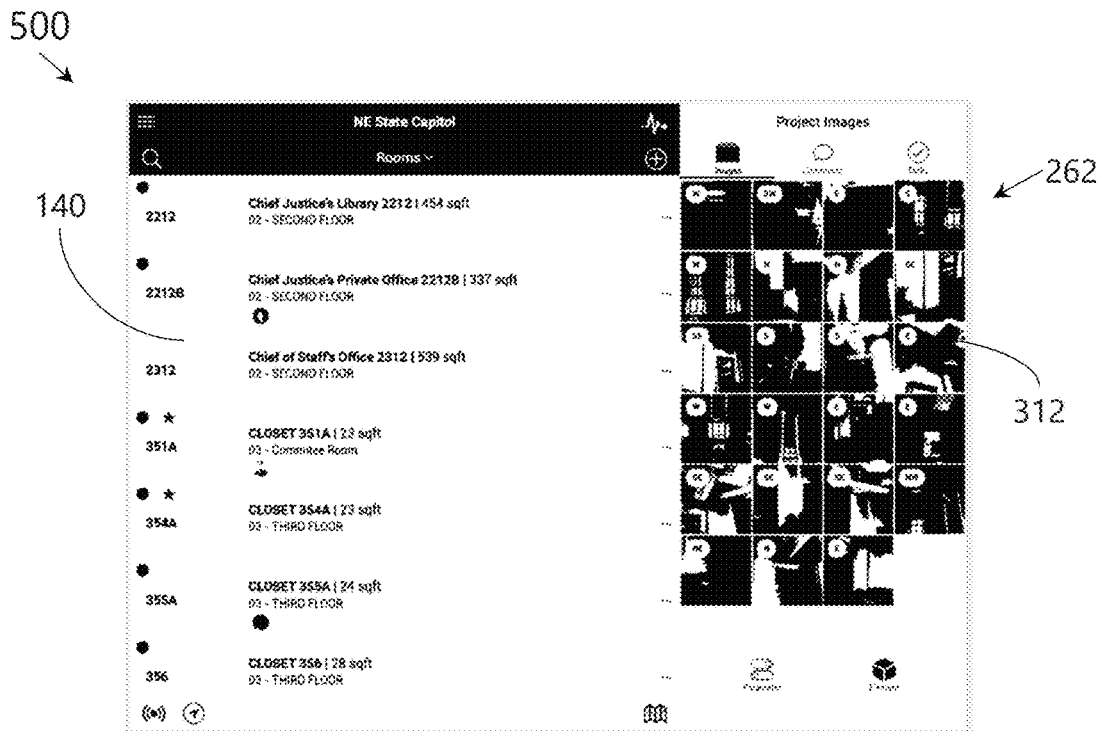

Referring in particular to FIG. 5B, the logical model 500 may include access to unit layers 140 as well as images 262 corresponding to physical elements or components, e.g., doors (314, FIG. 3A), windows (316, FIG. 3A), fixtures, or features of a particular floor or room. Images 262 may be captured by mobile devices (220a-c, FIGS. 3A/B) configured to access and update the logical model 500. For example, any images 262 captured by a mobile device 220a-c may include image metadata that may be analyzed by the logical model 500 to learn more about the image and what it portrays. Images 262 may be associated with pose data (312) sensed by accelerometers or other inertial sensors of the mobile devices 220a-c in order to estimate the direction faced by the mobile device at the time of capture, and thus accurately orient the images 262 and any physical features portrayed thereby (e.g., doors 314, windows 316) within the logical model 500, such that the internal geometry of the logical model (and of every floor, room, or unit represented thereby) accurately corresponds to its real-world counterpart.

Figure 5C:
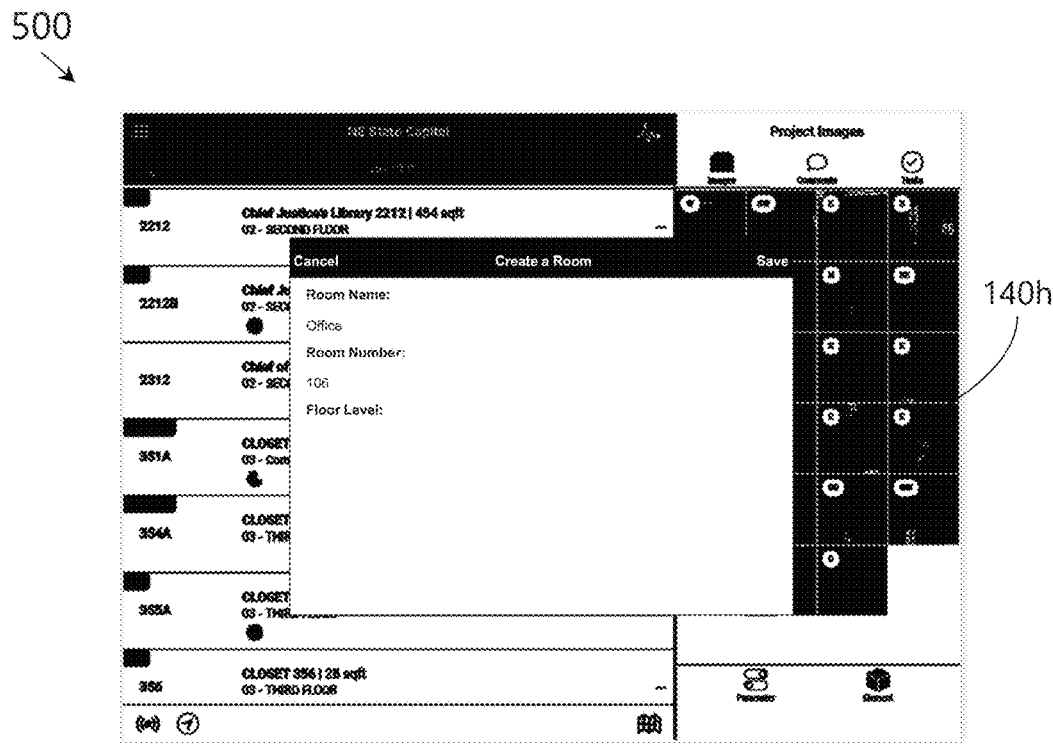
Figure 5D:
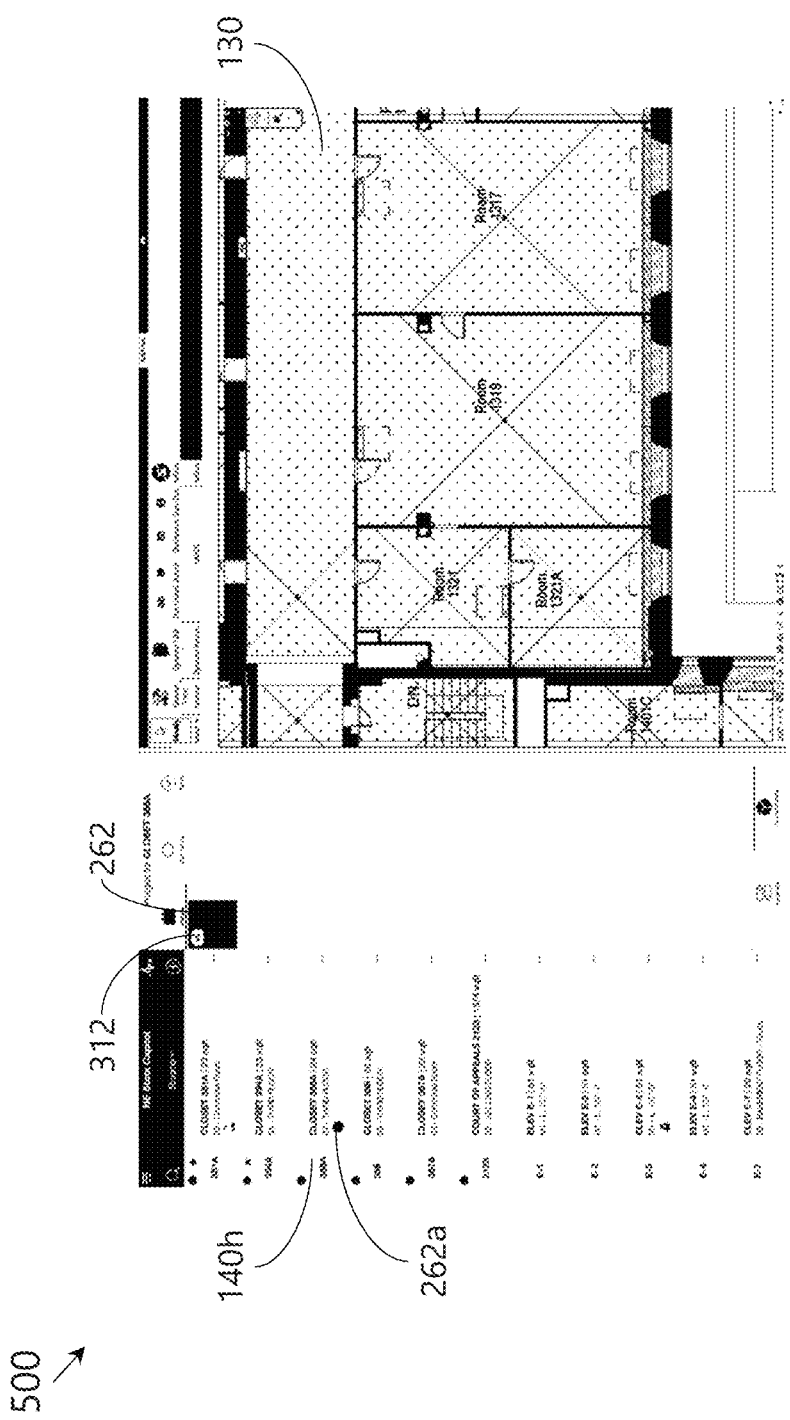

Referring in particular to FIG. 5C, the logical model 500 may provide end users (via mobile devices 220a-c (FIGS. 3A/B)) to create new unit layers (140h) as needed to match the layout of the floor layer 130 or progress throughout, as construction or repair finishes in some rooms of the floor layer and starts in other rooms. Referring in particular to FIG. 5D, new unit layers 140h may be created based on the position and orientation of the corresponding room within the floor corresponding to the underlying floor layer (130) and associated with any images (262a) corresponding to features within the room (e.g., a ceiling-mounted light fixture). Images 262a may be associated with a new unit layer 140h manually (e.g., by the end user creating the unit layer) or automatically (e.g., if the logical model 500 determines, based on other unit layers, floor layers, or images, that the position or orientation of the corresponding fixture places it within the room.

Figure 5E:
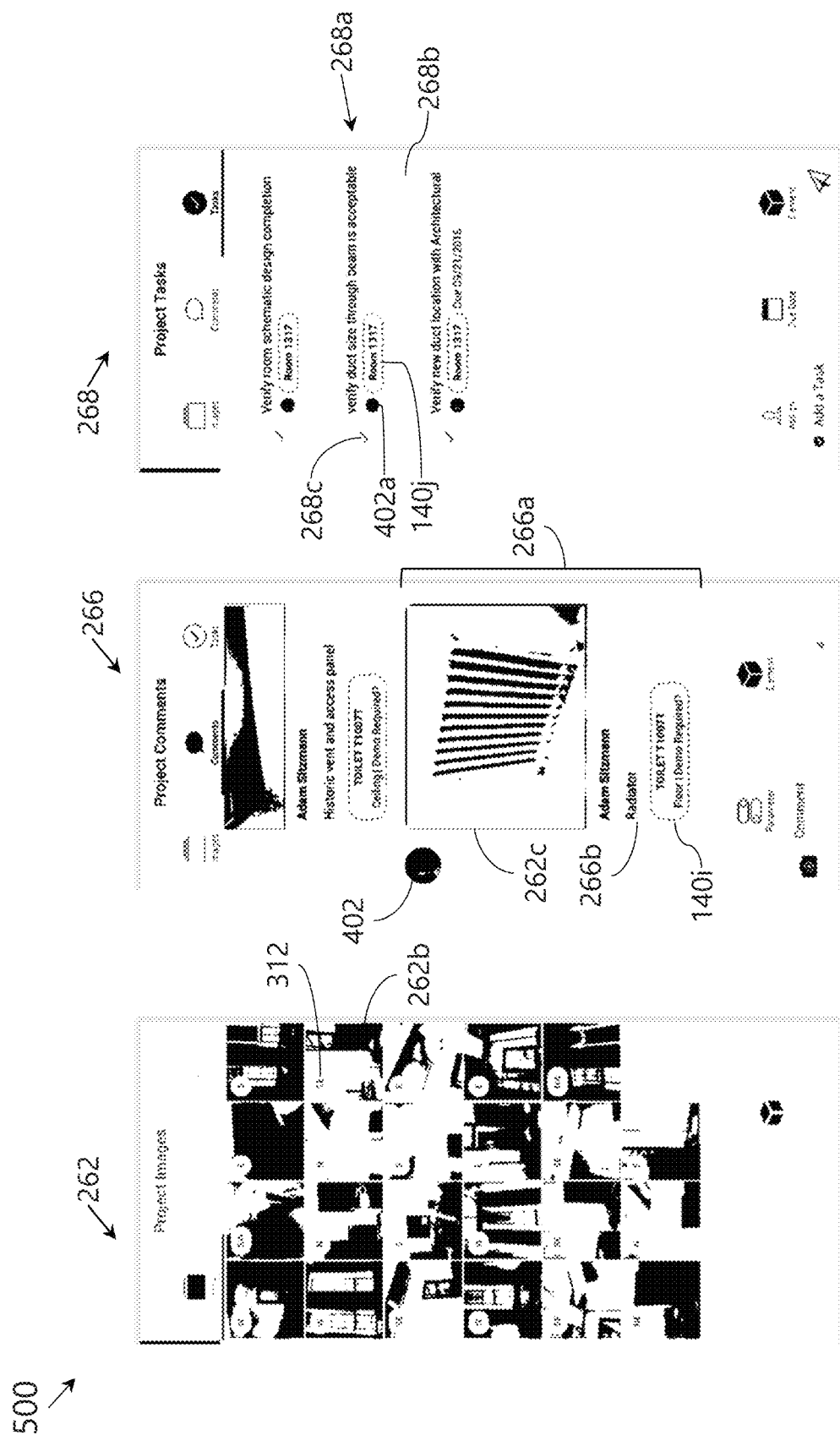

Referring in particular to FIG. 5E, the logical model 500 may allow an end user to toggle between displayed images (262), collaborative messaging (266), and ongoing tasks (268). For example, individual images (262a) corresponding to physical elements may be tagged with any identified pose data (312) or location data (310). Logged collaborative messages (266a) may identify the end user (402) from whom the message originated, a relevant image (262c) and explanatory text (266b) associated with, e.g., identifying the portrayed feature, conveying a request, or answering a previous request. The message 266a may be associated with a particular unit layer (140i) or task corresponding to or including the room within which the image was captured. Individual tasks (268a) may be classified (268b) as, e.g., structural, mechanical, electrical and may include end users (402a) to whom the task is assigned, any associated unit layers (140j) or floor layers; and indicators of whether or not the task has been completed (268c).

Figure 6:
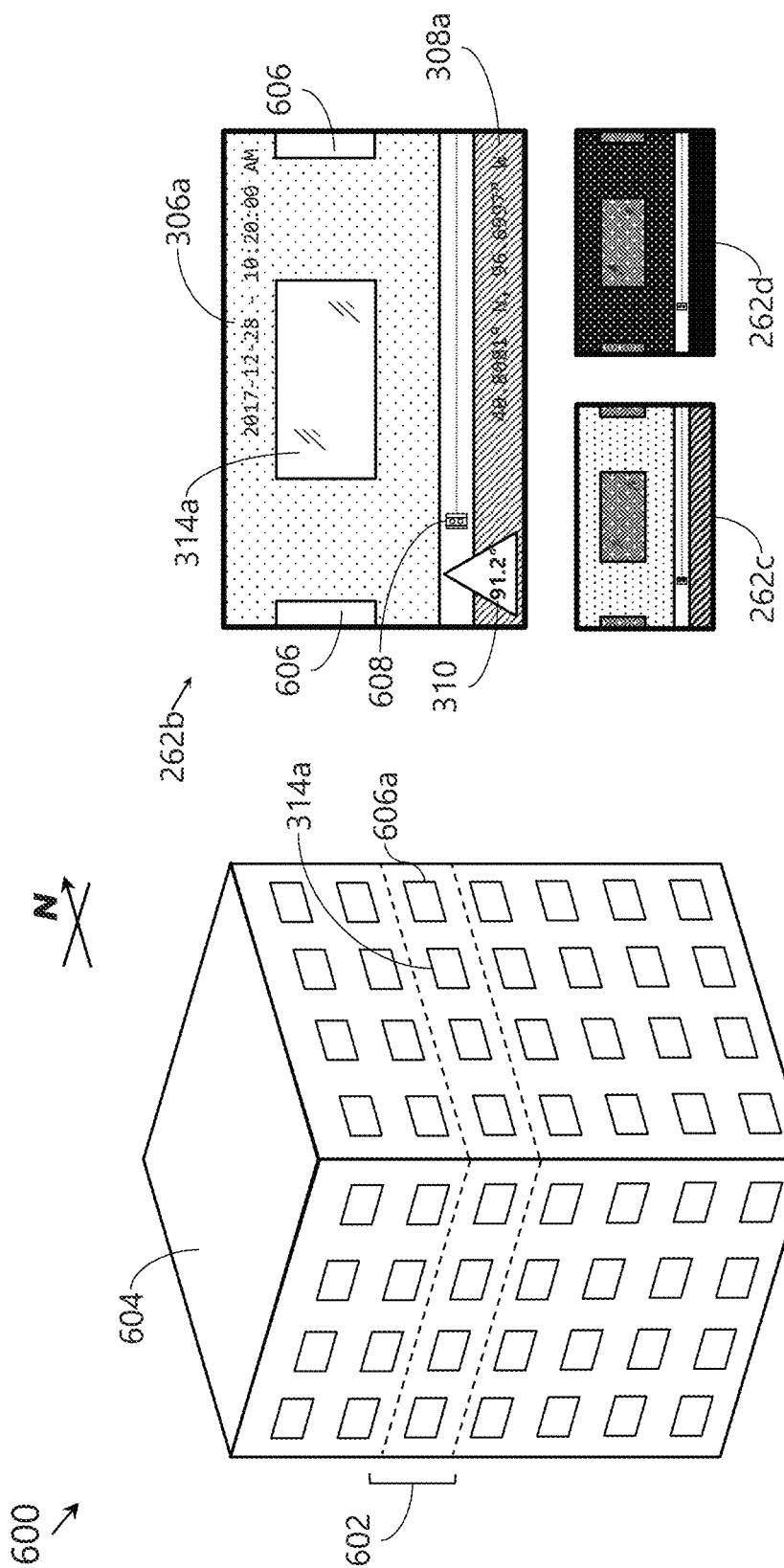
FIG. 6 is a view of operations of the logical model of FIG. 1.

Referring to FIG. 6, the logical model 600 may be implemented and may function similarly to the logical model 500 of FIGS. 5A through 5E, except that the logical model 600 may incorporate the classification engine (320, FIG. 3A) to use machine learning techniques to determine additional information about images 262b submitted to the logical model, e.g., if this information is not otherwise provided by end users (e.g., via collaborative messages 266a, FIG. 5E). The logical model 600 may be updated via any of the user-specific logical model configurations described by FIG. 2A (e.g., architect/designer model 210, tenant/prospect model 250, planner/manager model 240, contractor model 230). For example, a contractor installing a particular window (316a) on a particular floor (602) of a building 604 may add a photograph or image (262b) of the completed window to the logical model 600. While conventionally the contractor may include a textual description (266a, FIG. 5E) indicating that a window was installed (and precisely which window), so that the image 262b and/or message may be tied to the corresponding window 316a, the logical model 600 may "learn" this information (e.g., that the image 262a portrays a window, and perhaps that it portrays a specific window 316a) based on analysis of the image and/or image metadata by the classification engine 320.

For example, the contractor's image 262b of the completed window 134 may be geotagged with location data (310a). If the location data 310a is precise enough, the logical model 600 may infer, e.g., that the image 262b was captured on the east side of the building 604. If there are multiple windows on each side of the building 604, the choice of corresponding window (316a) may be narrowed down by the presence of adjacent windows (606) in the photograph (the correct floor 602 may otherwise be indicated by the logical model). Alternately, if the provided location data 310a is not sufficiently precise (e.g., if the contractor's location or orientation (pose data 312) cannot be established any more precisely than "within the building 604"), the logical model 600 may infer location in other ways. For example, the logical model 600 may infer, as noted above, that the corresponding window 316a is not a corner window 606a (due to the presence of adjacent windows 606 on both sides within the image 306a). The logical model 600 may analyze the submitted image 262b and determine, based on pixel analysis, that the ambient light within the room in which the image was captured is relatively high (e.g., compared to other interior views 262c-d of similar windows taken at similar times but different locations, or at similar locations at different times). If, for example, the image metadata (e.g., time data 308a) indicates that this particular image 262b was captured in the morning and during the winter (e.g., when sunrise occurs relatively later in the morning than in the summer), the logical model 600 may infer that the image was captured facing east, and that the window 316a is on the east side of the building 604. The image metadata may include pose data 312, which the logical model 600 may use in making or in checking said inference. For example, the pose data 312 may confirm that the mobile device (220a-c, FIGS. 3A/B) used to capture the image 306a was oriented to the east (91.2°, where 90° corresponds to due east) at the time the image was captured. If there are multiple east-facing interior windows (606; e.g., non-corner windows) on a particular floor 602, the correct window 320a may further be determined by cross-referencing the image 306a with the known locations of other fixtures featured in the image, such as an electrical outlet (608). The more metadata available to the logical model 600, the higher the confidence level in establishing unknown details in this way.

Figure 7A:
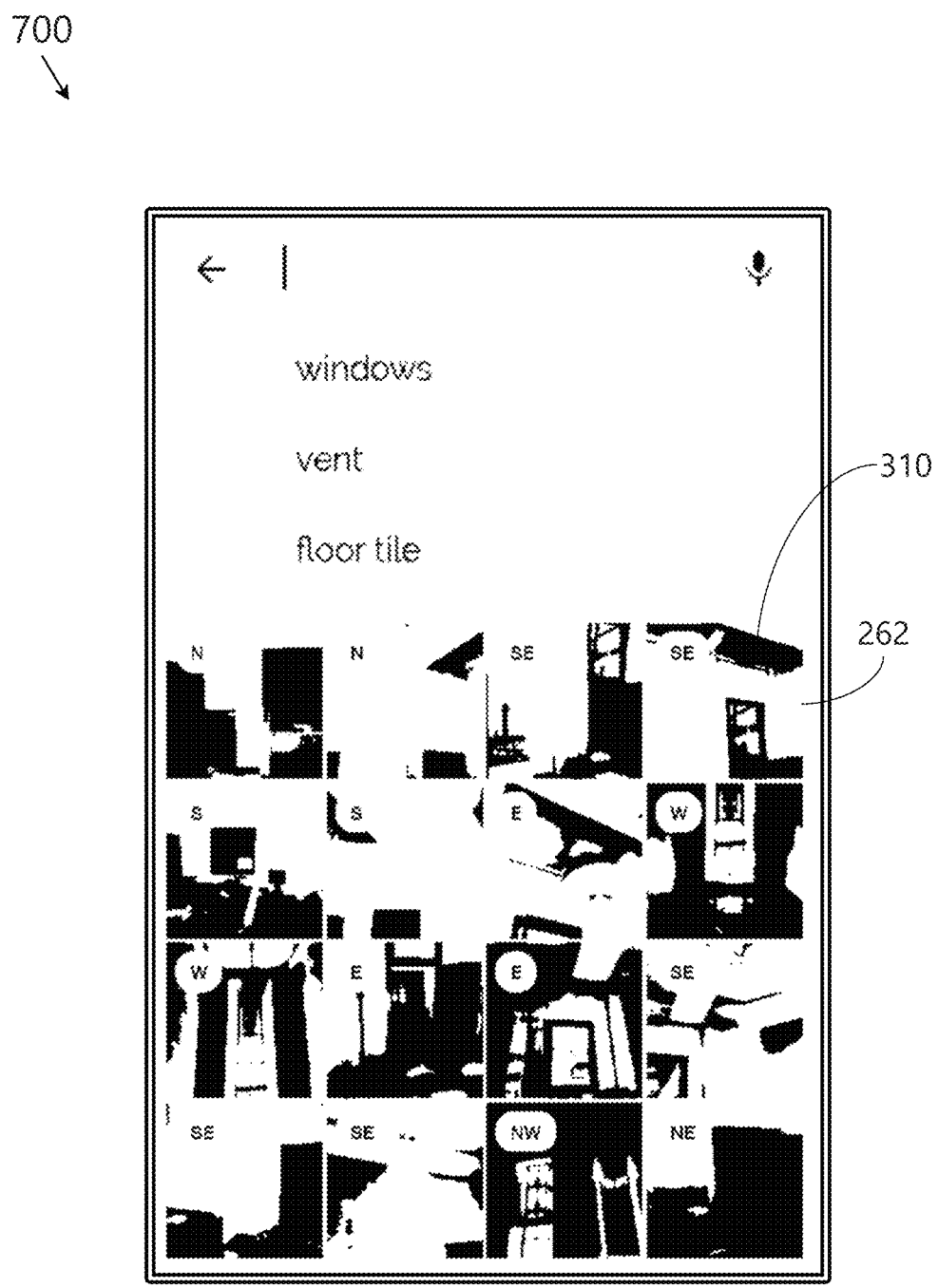
FIGS. 7A through 7G are views of operations of the logical model of FIG. 1.

Referring generally to FIGS. 7A through 7G, the logical model 700 may be implemented and may function similarly to the logical model 600 of FIG. 6, except that the logical model 700 may incorporate the classification engine (320, FIG. 3A) to identify the precise physical elements (e.g., doors, windows, walls, fixtures, outlets) featured in images 262 submitted to the logical model. Referring in particular to FIG. 7A, while submitted images may include pose data 312, it may not be possible for the logical model 700 to identify features based on image metadata. The classification engine 320 may learn, based on analysis of a large volume of images 262, to identify common patterns between images (e.g., color, shape, texture) and thereby identify the elements featured in each image and additional information (e.g., the material composition of various features, the emotional tone of submitted messages) that may assist the logical model 700 in accurately recording multiple and diverse aspects of the construction process as well as the continuing lifecycle of a finished building.

Figure 7B:
Figure 7C:
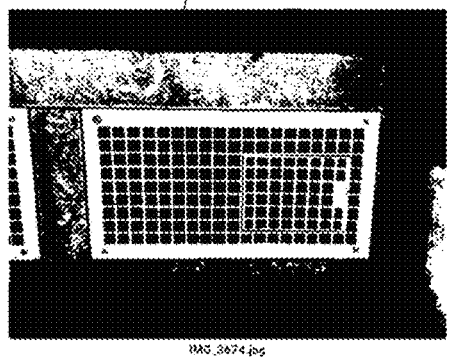
Figure 7D:
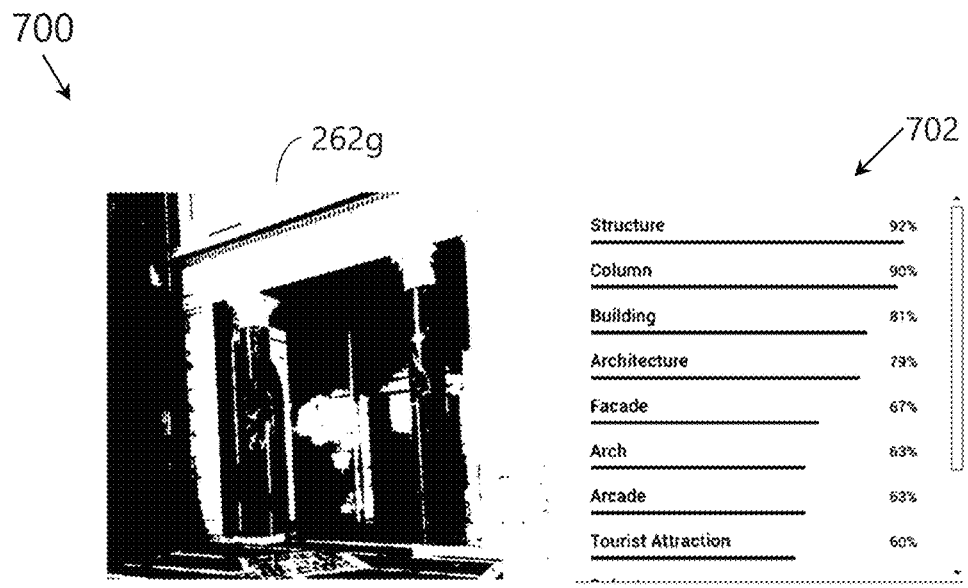
Figure 7E:
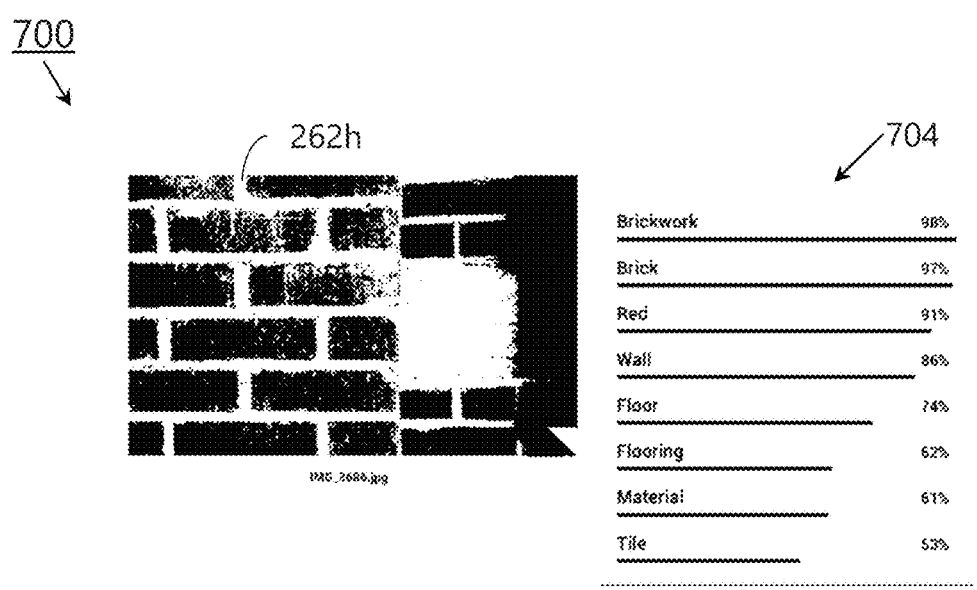

Referring in particular to FIGS. 7B and 7C, the logical model 700 (via the classification engine 320) may compare submitted images 262e-f to previously submitted images already entered into the logical model (and associated with known classifications such as an element type) and thereby determine (702) which classifications best apply to the submitted images 262e-f, and to what level of confidence. Referring in particular to FIGS. 7C and 7D, if the determined level of confidence is sufficiently high (e.g., 90% or higher), the classification engine 320 may add the associated classification (e.g., "vent", "structure", "column") as an identifier of the submitted image 262f-g. Referring in particular to FIG. 7E, submitted images (262h) may additionally be compared (704) to identify the material composition of the features described (e.g., brick, wood, concrete). If the confidence level is sufficiently high, any associated classifications (e.g., "brickwork", "brick", "red") may be added to the image 262h.

Figure 7F:
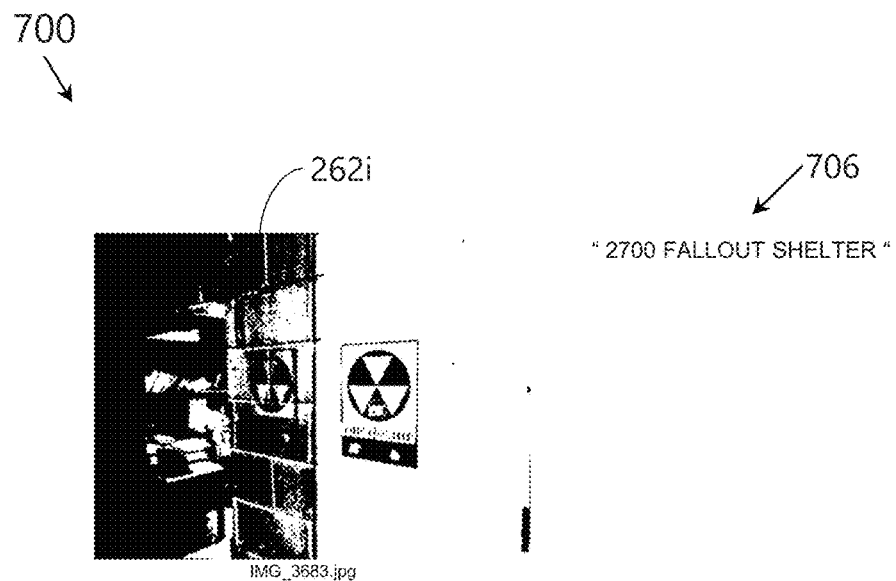
Figure 7G:
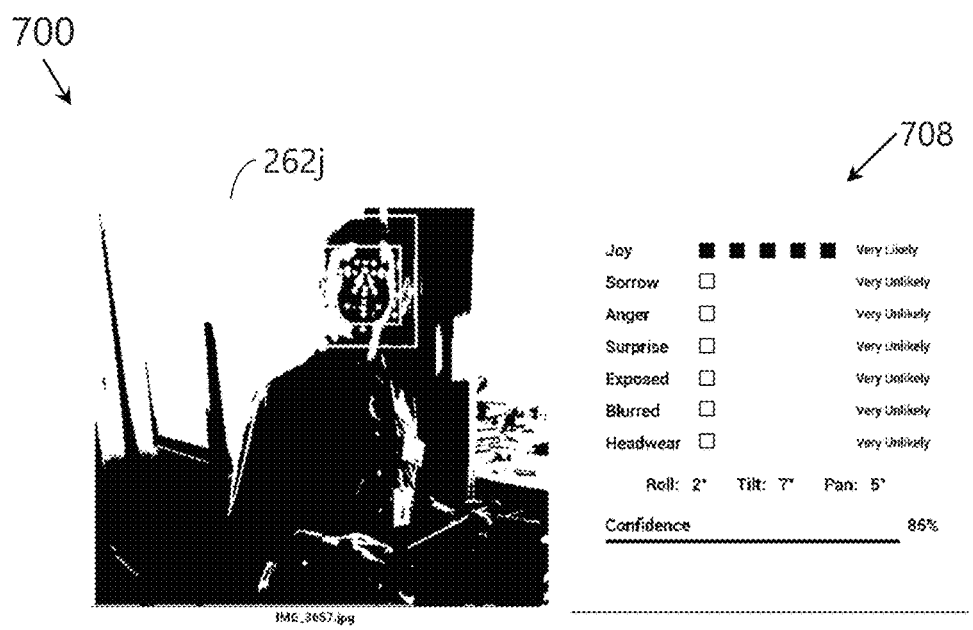

Referring to FIGS. 7F and 7G, the logical model 700 (via the classification engine 320) may incorporate optical character recognition and facial recognition techniques (706) to "read" signage featured in a submitted image 262i and thereby "learn" about the portrayed features (e.g., the image 262i features a fallout shelter in room 2700). Further, the logical model 700 may analyze the faces of persons shown by a submitted image 262j to determine if the image portrays a user (and if so, which user). The logical model 700 may attempt to associate (708) the individual featured in the submitted image 262j with emotional states (based, e.g., on a comparison with other images of that individual or an analysis of facial features) in order to determine, e.g., that a tenant following up on a completed repair is pleased with the repair (e.g., displays joy).

I claim:

1. A mobile communications device for management of a property by a user, the mobile communications device comprising:
   at least one display unit;
   at least one processor;
   at least one memory coupled to the processor, the memory configured for storage of one or more sets of processor-executable instructions;
   one or more peripheral devices coupled to the processor, each peripheral configured to collect data input selected from a group including message input, audio input, or image input;
   the one or more sets of processor-executable instructions configured to direct the at least one processor to:
      interact with at least one model associated with a property managed by the user, the property comprising a plurality of managed units, by displaying, via the display unit, one or more of:
      a model element of the model associated with at least one of a feature or a fixture of the property, the model element based on building data associated with the property, the model element including at least one virtual representation of the feature or fixture;
      or
      a stakeholder input associated with at least one of the feature or the fixture, the stakeholder input submitted to the at least one model by a stakeholder of the property;
      add to the at least one model at least one manager input collected by the one or more peripheral devices; and
      determine, via a classification engine trained by machine learning techniques, at least one relationship between at least two of the model element, the stakeholder input, or the manager input.

2. The mobile communications device of claim 1, wherein the classification engine is at least partially embodied in the at least one processor.

3. The mobile communications device of claim 1, wherein the classification engine is embodied in one or more of:
   a server wirelessly linked to the mobile communications device;
   or
   a cloud-based data storage wirelessly linked to the mobile communications device.

4. The mobile communications device of claim 1, further comprising:
   data storage configured to store one or more of the at least one model, the stakeholder input, or the manager input.

5. The mobile communications device of claim 1, wherein the feature or fixture includes at least one of a room, a door, a window, or a wall.

6. The mobile communications device of claim 1, wherein the feature or fixture includes at least one of a plumbing fixture, a lighting fixture, an electrical connection, or a data connection.

7. The mobile communications device of claim 1, wherein the stakeholder includes at least one of a contractor or a subcontractor.

8. The mobile communications device of claim 7, wherein the stakeholder input is associated with at least one of: a delivery of the feature or fixture; an installation of the feature or fixture; a completion of the feature or fixture; a repair of the feature or fixture; a replacement of the feature or fixture; or a cost update.

9. The mobile communications device of claim 1, wherein the stakeholder includes at least one tenant associated with a managed unit of the property.

10. The mobile communications device of claim 1, wherein the stakeholder input includes at least one service request associated with the feature or fixture.

11. The mobile communications device of claim 1, wherein the stakeholder input includes at least one scheduled maintenance associated with the feature or fixture.

12. The mobile communications device of claim 1, wherein each of the stakeholder input and the manager input includes at least one of: location data, time data, or pose data.

13. The mobile communications device of claim 1, wherein:
   the at least two of the model element, the stakeholder input, and the manager input includes at least one image;
   and
   the classification engine is configured to determine the at least one relationship based on one or more of: metadata, location data, time data, or pose data associated with the at least one image.

14. The mobile communications device of claim 1, wherein:
   the classification engine is configured to determine the at least one relationship by identifying at least one pattern common to the at least two of the model element, the stakeholder input, and the manager input includes at least one image.

* * * * *